(12) United States Patent
Binnard et al.

(10) Patent No.: US 7,692,768 B2
(45) Date of Patent: Apr. 6, 2010

(54) IRON CORE MOTOR DRIVEN AUTOMATIC RETICLE BLIND

(75) Inventors: Michael B. Binnard, Belmont, CA (US); Douglas C. Watson, Campbell, CA (US); Christopher S. Margeson, Mountain View, CA (US)

(73) Assignee: Nikon Corporation, Tokyo (JP)

( * ) Notice: Subject to any disclaimer, the term of this patent is extended or adjusted under 35 U.S.C. 154(b) by 603 days.

(21) Appl. No.: 11/427,439

(22) Filed: Jun. 29, 2006

(65) Prior Publication Data

US 2008/0002173 A1   Jan. 3, 2008

(51) Int. Cl.
G03B 27/54 (2006.01)
G03B 27/42 (2006.01)
G03B 27/62 (2006.01)

(52) U.S. Cl. .............................. 355/67; 355/53; 355/75
(58) Field of Classification Search .................. 355/53, 355/67–71, 75; 310/10, 12; 318/135, 649
See application file for complete search history.

(56) References Cited

U.S. PATENT DOCUMENTS

| | | | | |
|---|---|---|---|---|
| 5,760,881 | A * | 6/1998 | Miyazaki et al. | 355/71 |
| 6,078,381 | A * | 6/2000 | Suzuki | 355/53 |
| 6,906,789 | B2 * | 6/2005 | Carter et al. | 355/75 |
| 6,949,846 | B2 | 9/2005 | Sugita et al. | |
| 7,307,689 | B2 * | 12/2007 | Du Mee et al. | 355/53 |
| 2003/0117026 | A1 | 6/2003 | Korenaga | |
| 2003/0227268 | A1 | 12/2003 | Smith | |
| 2004/0007921 | A1 | 1/2004 | Harned et al. | |
| 2004/0080225 | A1 | 4/2004 | Takashima | |
| 2004/0155535 | A1 | 8/2004 | Hashimoto et al. | |
| 2004/0217659 | A1 | 11/2004 | Godkin | |
| 2004/0246458 | A1 | 12/2004 | Hol et al. | |
| 2005/0002803 | A1 | 1/2005 | Kim | |
| 2005/0029877 | A1 | 2/2005 | Harned et al. | |
| 2005/0134122 | A1 | 6/2005 | Uchida | |
| 2005/0236912 | A1 | 10/2005 | Beakley et al. | |
| 2005/0242675 | A1 | 11/2005 | Thornton et al. | |
| 2005/0280315 | A1 | 12/2005 | Miyamoto et al. | |
| 2006/0006743 | A1 | 1/2006 | Kawai | |
| 2006/0012252 | A1 | 1/2006 | Miyata et al. | |
| 2006/0043799 | A1 | 3/2006 | Niwatsukino | |

FOREIGN PATENT DOCUMENTS

EP       1511164 A2    3/2005
WO       2006/068233   6/2006

* cited by examiner

*Primary Examiner*—Hung Henry Nguyen

(57) ABSTRACT

Methods and apparatus for shielding a reticle within an illumination system are disclosed. According to one aspect of the present invention, a blind arrangement for shielding an object such as a reticle includes a coil assembly which has at least one coil, an air supply that supplies air, and a first blind portion. The first blind portion includes at least one magnet and is not in physical contact with the coil. The first blind portion is supported at a distance from the coil by the air, and the coil assembly cooperates with the magnet to cause the first blind portion to move. The first blind portion shields the object when the first blind portion is in a first position.

22 Claims, 14 Drawing Sheets

IRON CORE MOTOR DRIVEN AUTOMATIC RETICLE BLIND

BACKGROUND OF THE INVENTION

1. Field of Invention

The present invention relates generally to shielding reticles in lithographic systems. More particularly, the present invention relates to a blind which may be opened and closed as needed to control the projection of a laser beam through a reticle.

2. Description of the Related Art

For photolithography procedures which are used in the fabrication of semiconductors, the ability to control the procedures is important to ensure that semiconductors are accurately formed. By way of example, exposure processes which allow for the transfer of a circuit pattern from a reticle onto a wafer must be carefully controlled to ensure that the circuit pattern is accurately transferred onto a desired portion of the wafer. When the circuit pattern is not accurately transferred onto a desired portion of the wafer, the quality and the performance of semiconductors formed from the wafer may be compromised.

A laser beam generally passes through a reticle to transfer a circuit pattern from the reticle onto a wafer. To prevent the laser beam from passing through the reticle until after an appropriate area of the wafer is positioned under the reticle, reticle blinds are often used to shield the reticle from a laser until the wafer is properly positioned. Reticle blinds, which are typically used in a horizontal orientation, often utilize lead screws on mechanical bearings to enable the blinds to be opened and closed. In many applications, the reticle blinds are not capable of being opened and closed relatively quickly. When a reticle blind may not be closed relatively quickly, a reticle may remain exposed to a laser longer than desired. As a result, an exposure process may be compromised.

Some reticle blinds are arranged to be operated at higher speeds. However, when such reticle blinds are moved at relatively high speeds, disturbances and high reaction forces typically arise. Disturbances and high reaction forces often compromise the integrity of an exposure process.

Therefore, what is desired is a method and an apparatus which allows a reticle to be efficiently shielded from a laser until it is appropriate for the pattern on the reticle to be projected onto the surface of a wafer. That is, what is needed is a reticle blind which is capable of being opened and closed at a relatively high speed.

BRIEF SUMMARY OF THE INVENTION

The present invention relates to shielding a reticle within an illumination system. According to one aspect of the present invention, a blind arrangement for shielding an object such as a reticle includes a coil assembly, an air supply that supplies air, and a first blind portion. The first blind portion includes at least one magnet and is not in physical contact with a coil of the coil assembly. The first blind portion is supported at a distance from the coil by the air, and cooperates with the magnet to cause the first blind portion to move. The first blind portion shields the object when the first blind portion is in a first position.

In one embodiment, the blind arrangement includes an air bearing arrangement that has an air supply which supplies air though openings defined in the core. In another embodiment, the blind arrangement includes an anti-gravity device that supports a counter mass arrangement that includes the coil assembly against gravity forces.

A reticle blind that is suitable for use in a vertical orientation, i.e., such that a part or parts of the reticle blind move in a vertical direction, and is supported at a distance from a linear motor by an air bearing arrangement does not have tubes of cables attached thereto. Magnets on the reticle blind cooperate with a coil assembly to form a linear motor that enables the reticle blind to move precisely and relatively quickly. Anti-gravity devices such as air cylinders that support the coil of the linear motor, as well as procedures that may enable the reticle blind to be parked when power to the coil assembly is not provided, allow the reticle blind to be used in a vertical orientation.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE INVENTION

A reticle blind which is controlled by iron core motors is suitable for being opened and closed with a relatively high amount of precision and speed. By supporting the reticle blind on air bearings, and adding mechanisms to provide anti-gravity support to counter masses associated with the reticle blind, a reticle blind that is controlled by relatively high-efficiency iron core motors may be used in a vertical orientation, i.e., such a reticle blind may be arranged to open and close in a vertical direction. Further, as the reticle blind is supported on air bearings, there may be substantially no tubes or cables coupled to the reticle blind. As such, there are effectively no drag forces on the reticle blind, and the reticle blind may be moved precisely and quickly. Because of a low moving mass associated with the reticle blind, the reticle blind may also move at a relatively high speed.

Figure 1A:
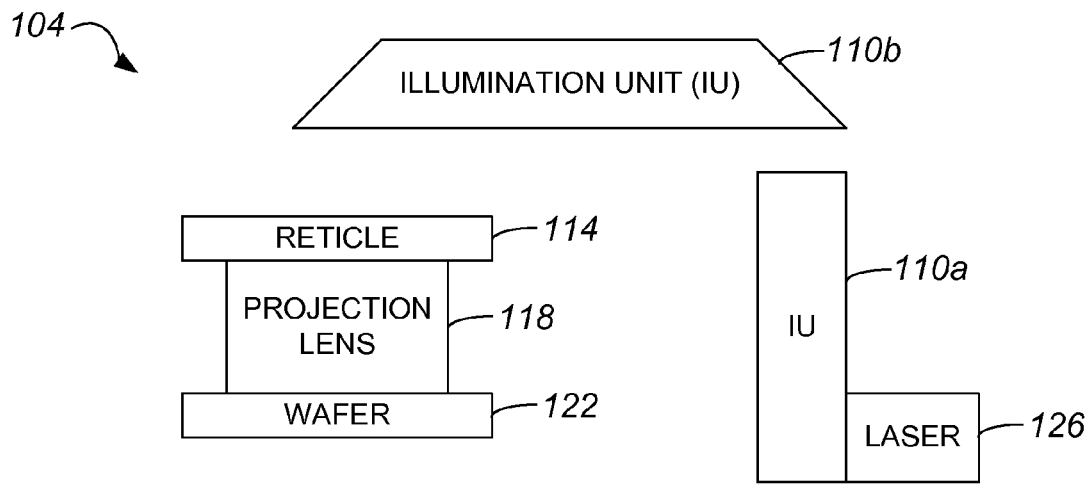
FIG. 1a is a block diagram representation of a system which allows a laser beam to be projected through a reticle to project a pattern onto a wafer in accordance with an embodiment of the present invention.

An overall system which may use a reticle blind provides a path that may be traversed by a laser beam between a laser source and a reticle. FIG. 1a is a block diagram representation of a system which allows a laser beam to be projected through a reticle to project a pattern onto a wafer in accordance with an embodiment of the present invention. A system 104 includes an illumination unit 110 that includes a first section 110a and a second section 110b. A laser beam generated by a laser or a laser source 126 is arranged to pass through first section 110a and second section 110b, and to be projected through a reticle 114. A projection lens 118 allows patterns on reticle 114 to be projected onto a surface of a wafer 122 when a laser beam passes through reticle 114. The path of a laser beam generated by laser source 126 will be discussed below with respect to FIG. 1b. As will be understood by those skilled in the art, reticle 114 is typically supported on a reticle stage (not shown), while wafer 122 is typically supported on a wafer stage (not shown). However, for ease of illustration, a reticle stage and a wafer stage are not shown.

Figure 1B:
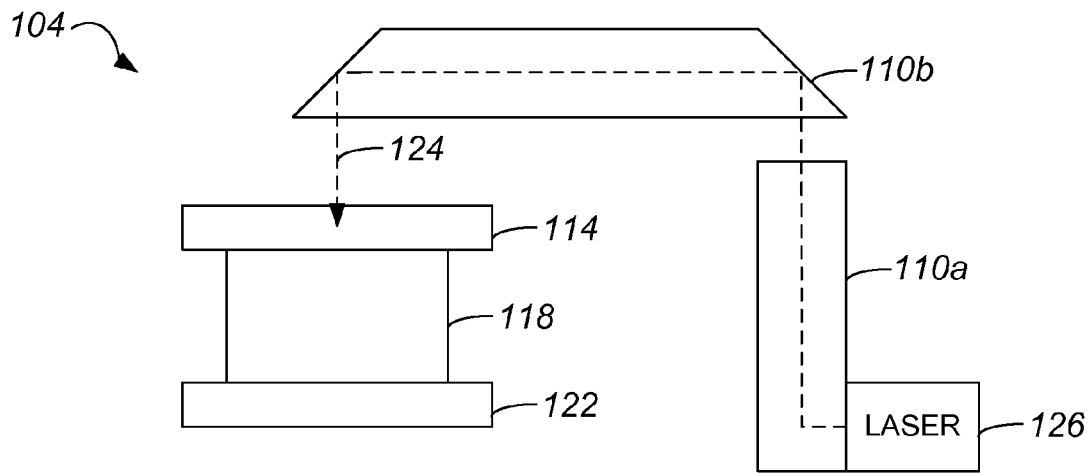
FIG. 1b is a block diagram representation of a system, i.e., system 104 of FIG. 1a, in which a laser beam follows a path from a laser source to a reticle in accordance with an embodiment of the present invention.

When laser source 126 generates a laser beam, the laser beam may reflect off of various surfaces within illumination unit 110. Referring next to FIG. 1b, the path of a laser beam from laser source 126 to reticle 114 will be described in accordance with an embodiment of the present invention. A laser beam 124 produced by laser source 126 may be reflected at an approximately 90 degree angle within first portion 110a of illumination unit 110. Laser beam 124 may be reflected off of a mirrored surface (not shown). Once reflected within first portion 110a, laser beam 124 passes through first portion 110a to second portion 110b. Within second portion 110b, laser beam 124 is reflected approximately 90 degree angles at two different points to enable laser beam 124 to follow a path that passes through reticle 114.

To protect wafer 122 from being exposed to laser beam 124 before an appropriate time, e.g., before the portion of wafer 122 to be exposed is situated in the path of laser beam 124, an automatic reticle blind is used to shield reticle 114 and, hence, wafer 122 from laser beam 124. An automatic reticle blind may be positioned horizontally, as for example within first portion 110a of illumination unit 110, or vertically, as for example within second portion 110b of illumination unit 110.

Figure 1C:
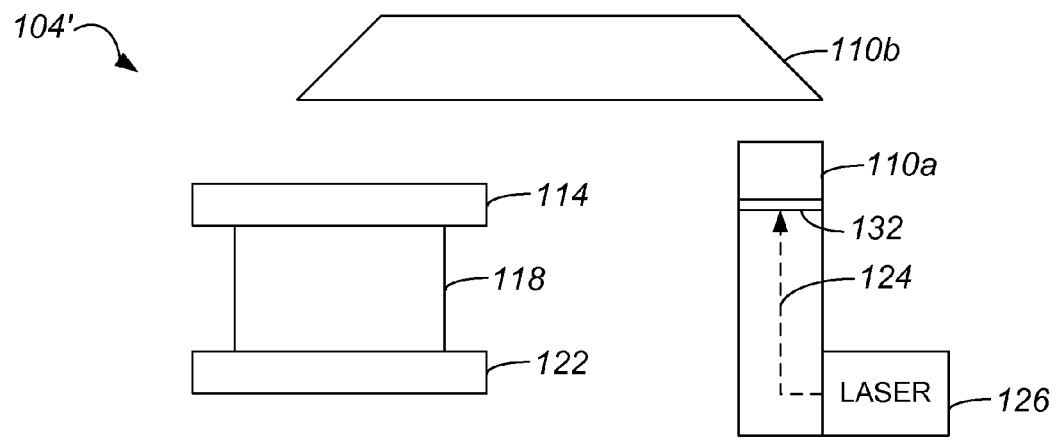
FIG. 1c is a block diagram representation of a system in which a horizontal automatic reticle blind is positioned in accordance with an embodiment of the present invention.

FIG. 1c is a diagrammatic representation of a horizontal automatic reticle blind positioned in first portion 110a of illumination unit 110. In system 104', a reticle blind 132 is positioned within first portion 110a. When in a closed or shut configuration, as shown, reticle blind 132 is arranged to prevent laser beam 124 from passing through reticle blind 132. A path for laser beam 124 to follow to reach reticle 114 is effectively obstructed by reticle blind 132. When reticle blind 132 is in an open configuration, laser beam 124 may pass through an opening in reticle blind 132 to reticle 114. Reticle blind 132 moves in a horizontal manner to allow the opening to be created.

Figure 1D:
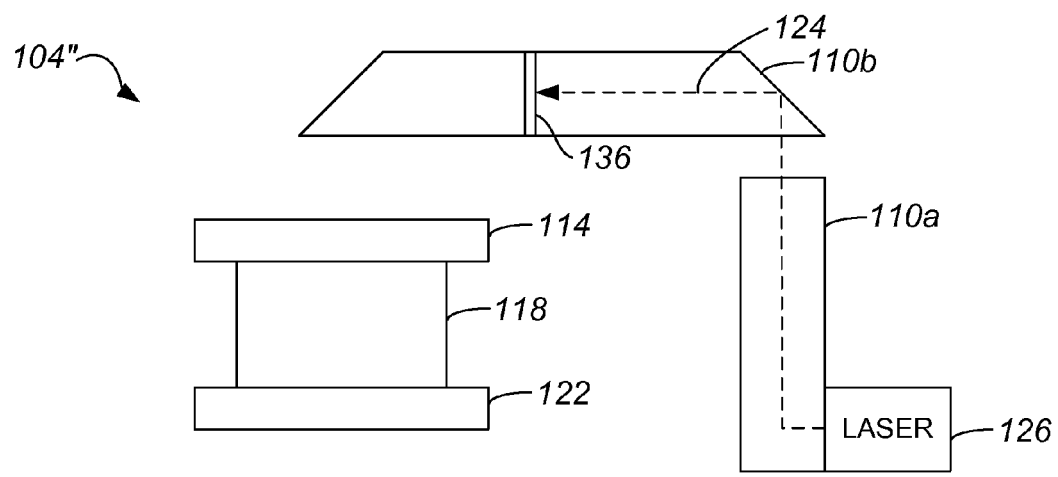
FIG. 1d is a block diagram representation of a system in which a vertical automatic reticle blind is positioned in accordance with an embodiment of the present invention.

In lieu of being positioned in first portion 110a of illumination unit 110, a reticle blind may instead be a vertical reticle blind that is arranged to be positioned in second portion 110b of illumination unit 110. With reference to FIG. 1d, a vertical reticle blind will be described in accordance with an embodiment of the present invention. A vertical reticle blind 136, when in a closed configuration, obstructs laser beam 124, and prevents laser beam 124 from passing through second portion 110b to reticle 114. As shown, vertical reticle blind 136 is arranged to block a path of laser beam 124 before laser beam 124 "turns" ninety degrees within second portion 110b towards reticle 114. When in an open configuration, vertical reticle blind 136 is allows laser beam 124 to pass through second portion 110b to reticle 114.

Figure 2A:
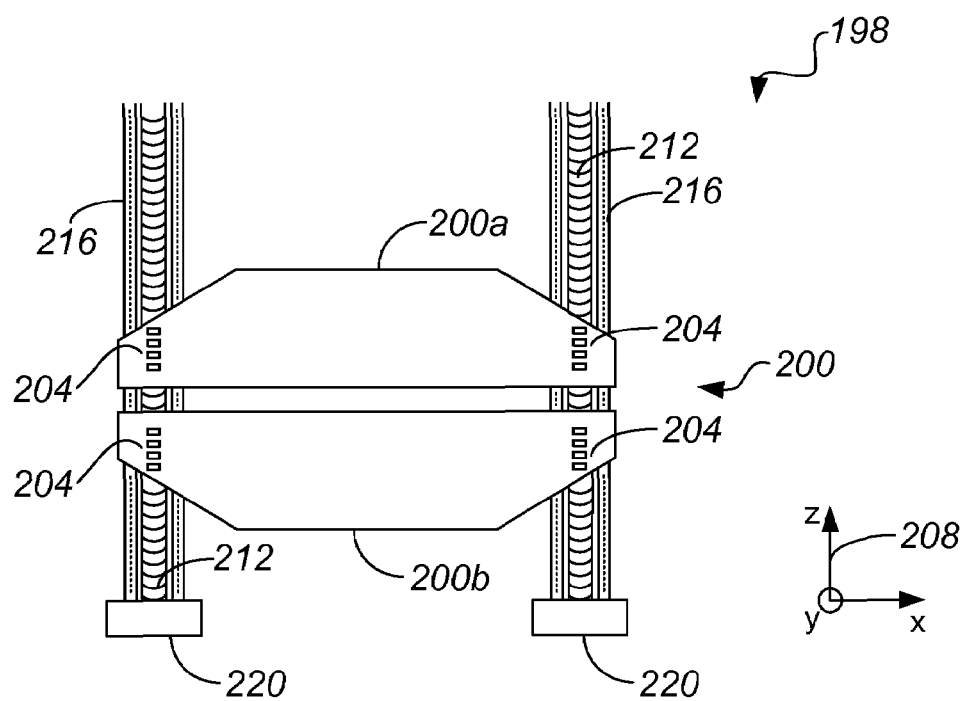
FIG. 2a is a diagrammatic representation of a vertical automatic reticle blind in accordance with an embodiment of the present invention.

FIG. 2a is a diagrammatic representation of a vertical automatic reticle blind in accordance with an embodiment of the present invention. A reticle blind system 198 includes a vertical automatic reticle blind assembly 200 that has a first blind portion 200a and a second blind portion 200b. First blind portion 200a and second blind portion 200b each include two magnet arrays 204 which, in cooperation with coil assemblies 212 associated with an iron core motor, allow first blind portion 200a and second blind portion 200b to move along a z-axis 208. In one embodiment, coil assemblies 212 effectively serve as at least part of a counter mass that absorbs forces generated when first blind portion 200a or second blind portion 200b moves. The use of an iron core motor allows the movement of first blind portion 200a and second blind portion 200b to be accurately controlled with a relatively high speed and a relatively high efficiency. Air bearings 216 are arranged as a guide for coil assemblies 212 or, more generally, a counter mass arrangement of which coil assemblies 212 are a component. Air bearings 216 may be fixed to a wall of an illumination unit (not shown).

Reticle blind 200 is supported on an air bearing arrangement (not shown), and is not directly coupled to the iron core motor that includes coil assemblies 212. Such an air bearing arrangement may be arranged to be incorporated into a coil stator (not shown), as will be described below with reference to FIG. 5b. Areas on blind portions 200a, 200b may be arranged to have substantially flat areas which are effectively small areas which move over an air cushion or layer associated the air bearing arrangement. Air, and/or vacuum, may be supplied to air bearing such that magnet arrays 204 and, hence, reticle blind 200 may be supported. The air bearing arrangement is arranged to be preloaded by an attraction of magnets in magnet arrays 204 to the iron core in coil assemblies 212 when coil assemblies 212 are energized.

As reticle blind system 198 is oriented vertically, i.e., such that first blind portion 200a and second blind portion 200b are arranged to move along z-axis 208, anti-gravity devices 220 are used to provide anti-gravity to a countermass that includes coil assemblies 212. In other words, anti-gravity devices 220 are arranged to compensate for gravity that acts on reticle blind system 198. The configurations of, as well as the positioning of, anti-gravity devices 220 may vary widely. Possible configurations for anti-gravity devices 220 will be described below with respect to FIGS. 7a-d. It should be appreciated that when reticle blind system 198 is used in a horizontal orientation, anti-gravity devices 220 are generally not necessary.

When reticle blind 200 is not in use, as for example between when power to coil assembly 212 is off between wafers or between batches of wafers, reticle blind 200 may be arranged to rest substantially at a bottom of reticle blind system 198. That is, reticle blind 200 may effectively be parked when not in use. In one embodiment, as reticle blind 200 may effectively be parked when not in use, anti-gravity devices may not be necessary to provide anti-gravity for reticle blind 200.

Reticle blind system 198 generally utilizes a positioning system that includes a motor, i.e., a linear motor that includes coil assembly 212. The positioning system allows first blind portion 200a and second blind portion 200b to move with precision, as mentioned above. In one embodiment, the positioning system is arranged to support accelerations of up to approximately eight Gs, and velocities in the range of between approximately −2 meters/second (m/s) and approximately +2 m/s.

Figure 2B:
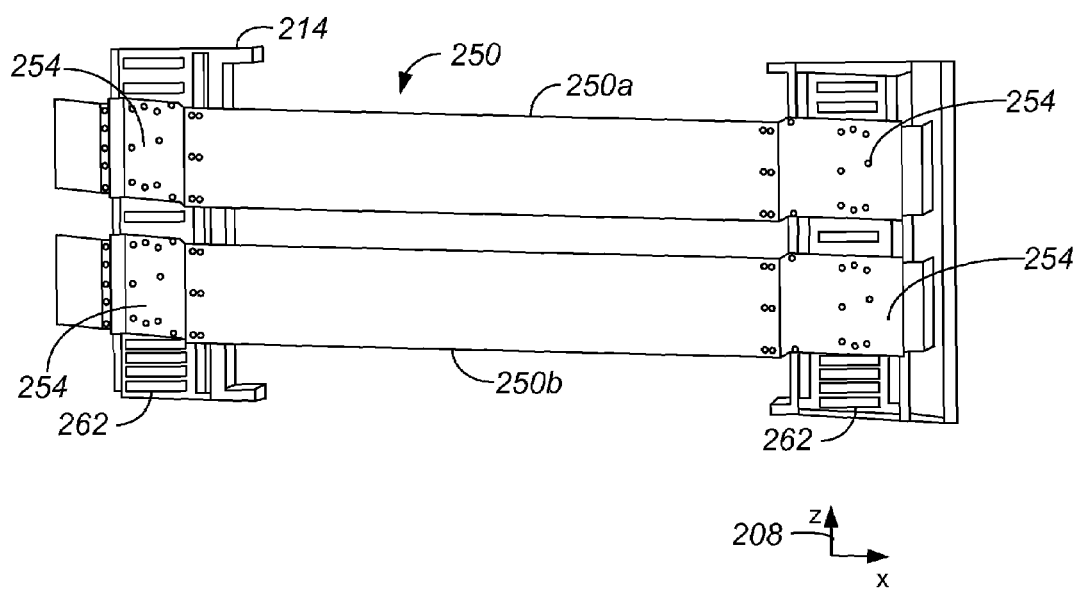
FIG. 2b is a diagrammatic representation of a reticle blind system that include substantially rectangularly shaped vertical automatic reticle blind halves in accordance with an embodiment of the present invention.

The shape and configuration of reticle blind 200 may vary widely. FIG. 2b is a diagrammatic representation of a reticle blind system that include substantially rectangularly shaped vertical automatic reticle blind halves in accordance with an embodiment of the present invention. A reticle blind system 198 includes a reticle blind assembly 250. Reticle blind assembly 250 includes a first blind half 250a and a second blind half 250b. Blind halves 250a, 250b include magnet arrays 254 which, in cooperation with a coil assembly 262, allow blind halves 250a, 250b to move relative to a z-axis 208. Though not shown, anti-gravity devices may be coupled to coil assembly 262 to provide anti-gravity to coil assembly 262. Coil assembly 262 is typically not directly in contact with blind halves 250a, 250b.

A counter mass base 214 is arranged to hold coil assembly 262 and, together with coil assembly 262, acts as a counter mass when at least one of first blind half 250a and second blind half 250b moves. Each blind half 250a, 250b, in the described embodiment, is arranged to be supported on an air bearing (not shown) that supports each blind half 250a, 250b adjacent to coil assembly 262, and facilitates the movement of each blind half 250a, 250b. Each blind half 250a, 250b may move substantially independently when individual coils in coil assembly 262 are independently controlled, i.e., when current to the individual coils is independently controlled.

Figure 3A:
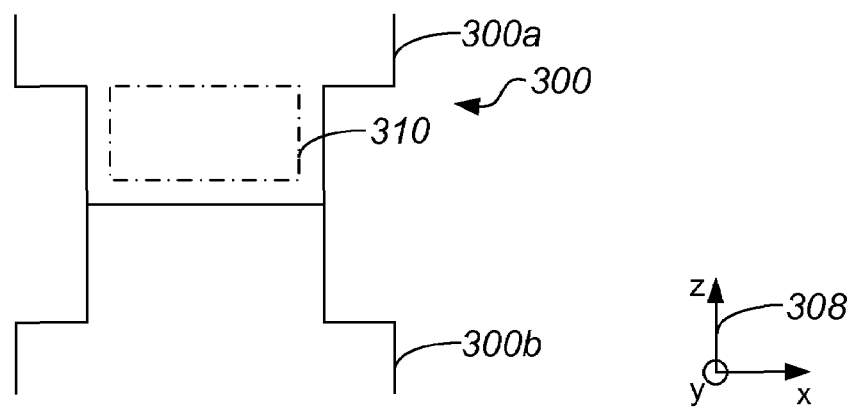
FIG. 3a is a diagrammatic representation of a reticle blind assembly in which a first reticle blind half shields an exposure area in accordance with an embodiment of the present invention.

Referring next to FIGS. 3a-e, one process of utilizing an automatic reticle blind will be described in accordance with an embodiment of the present invention. A reticle blind 300 includes a first blind half 300a and a second blind half 300b. While reticle blind 300 is shown as being a vertical reticle blind in that first blind half 300a and second blind half 300b are arranged to move in directions along a z-axis 308, it should be appreciated that reticle blind 300 may instead be a horizontal reticle blind. Reticle blind 300, when in a closed position as shown in FIG. 3a, is arranged to shield an exposure area 310 of a wafer. First blind half 300a and second blind half 300b each include an area that is arranged to shield exposure area 310.

As shown, exposure area 310 is positioned behind first blind half 300a, although the positioning of exposure area 310 may vary. Though shown as being directly behind reticle shield 300, exposure area 310 may actually be beneath reticle shield 300 such that reticle shield 300 protects exposure area 310 by blocking a laser beam before the laser beam is reflected onto exposure area 310. In other words, as shown in FIG. 1d, exposure area 310 and reticle shield 300 may both be along a path of a laser beam such that exposure area 310 may effectively be behind reticle shield 300, although exposure area 310 may not physically be directly behind reticle shield 300.

Figure 3B:
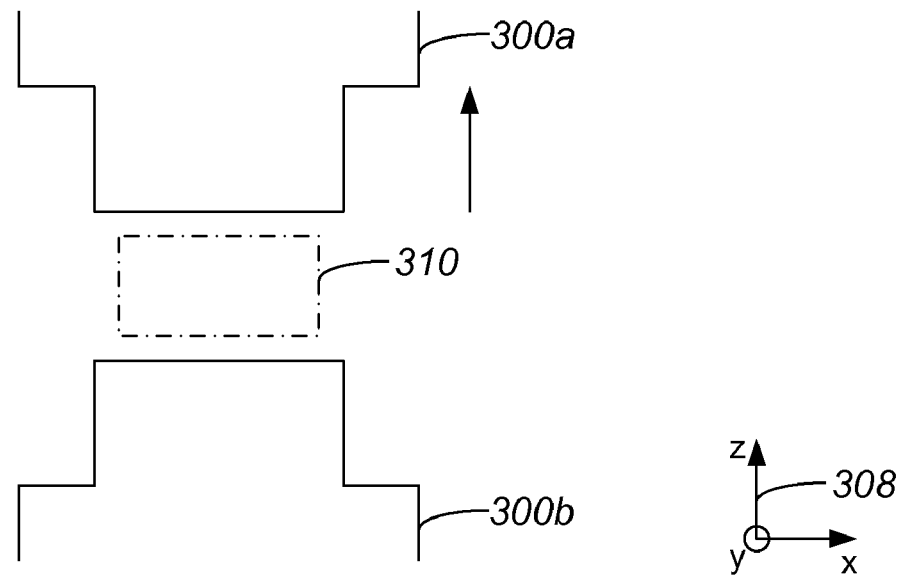
FIG. 3b is a diagrammatic representation of a reticle blind assembly, i.e., reticle blind assembly 300 of FIG. 3a, after a first reticle blind half moves to expose an exposure area in accordance with an embodiment of the present invention.

Once an exposure process is ready to begin, exposure area 310 may be exposed to a laser or, more specifically, a laser beam. Exposure area 310 is exposed when first blind half 300a is moved in a direction along z-axis 308 away from second blind half 300b, as shown in FIG. 3b. The movement of first blind half 300a to effectively open a slit between first blind half 300a and second blind half 300b is typically substantially synchronized with the motion of the reticle.

Figure 3C:
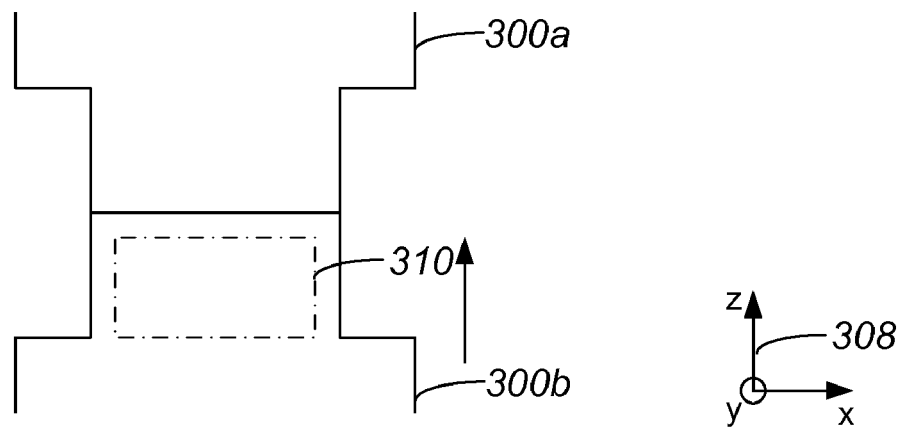
FIG. 3c is a diagrammatic representation of a reticle blind assembly, i.e., reticle blind assembly 300 of FIG. 3a, after a second reticle blind half moves to shield an exposure area in accordance with an embodiment of the present invention.

When first blind half 300a is moved away from second blind half 300b, the exposure process involving exposure area 310 may be performed. After the exposure process is completed with respect to exposure area 310, exposure area 310 may once again be shielded from a laser beam. To shield exposure area 310, second blind half 300b may be moved relative to z-axis 308 in a direction that allows second blind half 300b to shield exposure area 310. FIG. 3c is a representation of exposure area 310 being shielded by second blind half 300b.

Figure 3D:
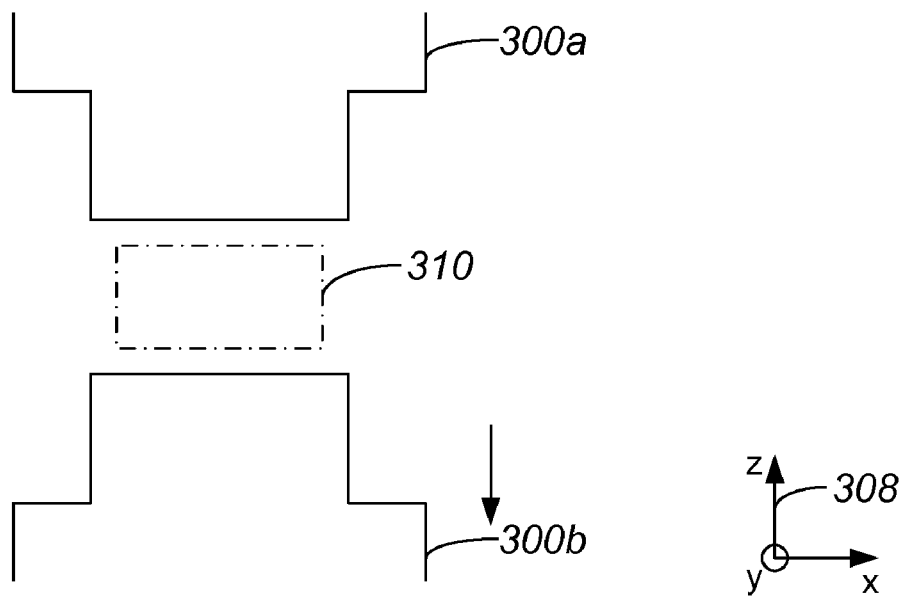
FIG. 3d is a diagrammatic representation of a reticle blind assembly, i.e., reticle blind assembly 300 of FIG. 3a, after a second reticle blind half moves to expose an exposure area in accordance with an embodiment of the present invention.
Figure 3E:
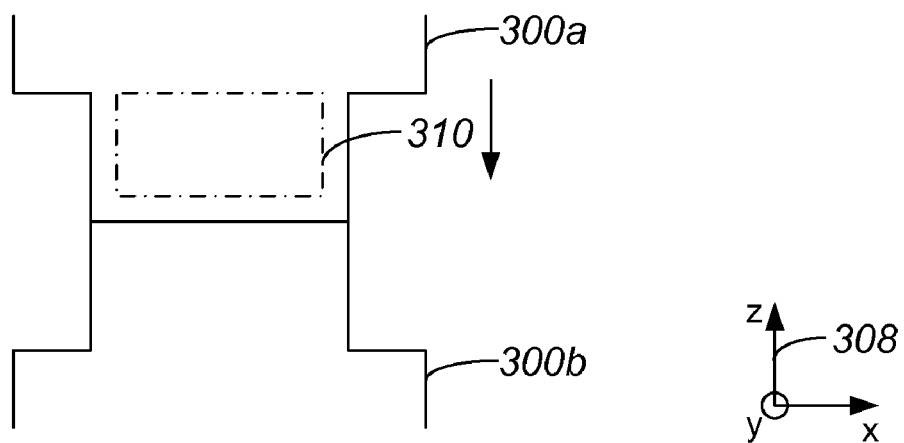
FIG. 3e is a diagrammatic representation of a reticle blind assembly, i.e., reticle blind assembly 300 of FIG. 3a, after a first reticle blind half moves to shield an exposure area in accordance with an embodiment of the present invention.

If exposure area 310 is once again to be exposed, since exposure area 310 is shielded by second blind half 300b, second blind half 300b is moved along z-axis 308 in a direction away from first blind half 300a. FIG. 3d is a representation of exposure area 310 being exposed to a laser once second blind half 300b is moved. After second blind half 300b is moved, a laser is no longer shielded and an exposure process may occur. When the exposure process is completed, first blind half 300a is moved along z-axis 308 toward second blind half 300b to shield exposure area 310, as shown in FIG. 3e.

Figure 4:
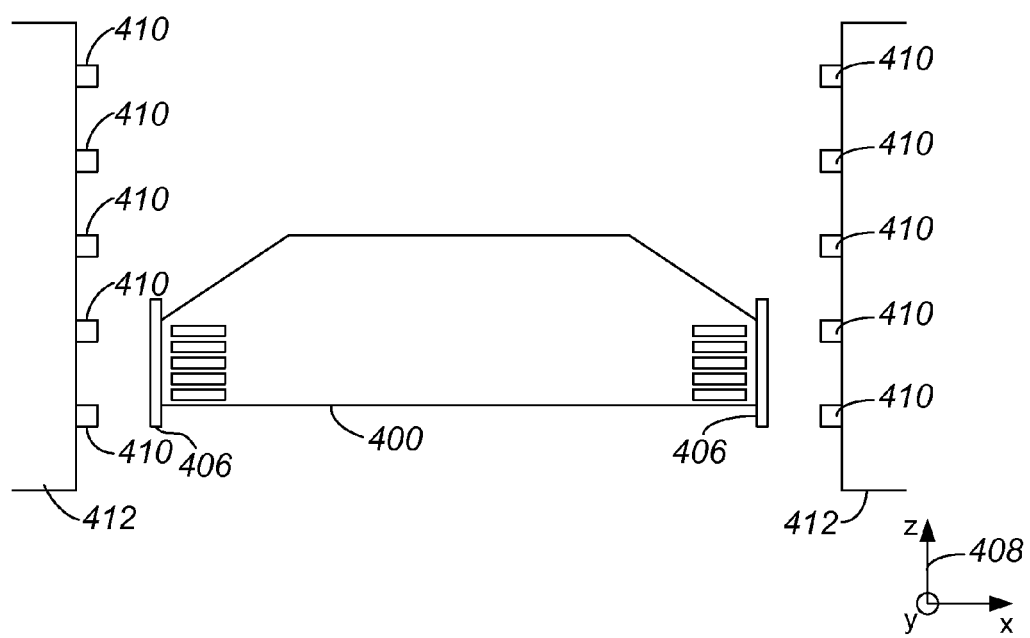
FIG. 4 is a diagrammatic representation of a position measurement system associated with a reticle blind in accordance with an embodiment of the present invention.

To precisely and accurately control the positioning of halves of a reticle blind, encoders or interferometers may be used to provide position feedback. In one embodiment, the translational and rotational position of a half of a vertical automatic reticle blind relative to a z-axis may be measured using encoders. With reference to FIG. 4, a position measurement system associated with a reticle blind will be described in accordance with an embodiment of the present invention. A reticle blind half 400, which may be of any suitable shape, is arranged between two counter masses 412. For ease of illustration, some components of a reticle blind assembly, as for example a second reticle blind half and a coil assembly, have not been shown although it should be appreciated that such components are generally present in a reticle blind assembly.

Reticle blind half 400 has at least one scale 406 that is arranged to be used by encoders 410 to measure a position of reticle blind half 400 relative to a z-axis 408. Encoders 410 may be linear encoders that are mounted on counter masses 412, e.g., coil assemblies, such that power cords and cables which carry information from encoders 410 to a computing system (not shown) are routed through counter masses 412. Although five encoders 410 have been shown as being mounted on each counter mass 412, the number of encoders 410 may vary widely.

Each scale 406 is sized, in one embodiment, to span two adjacent encoders 410. That is, each scale 406 is such that the read heads of two adjacent encoders 410 are able to read off of each scale 406 at substantially the same time. Information read from scales 406 by encoders 410 is used to determine the position of reticle blind half 400.

Figure 5A:
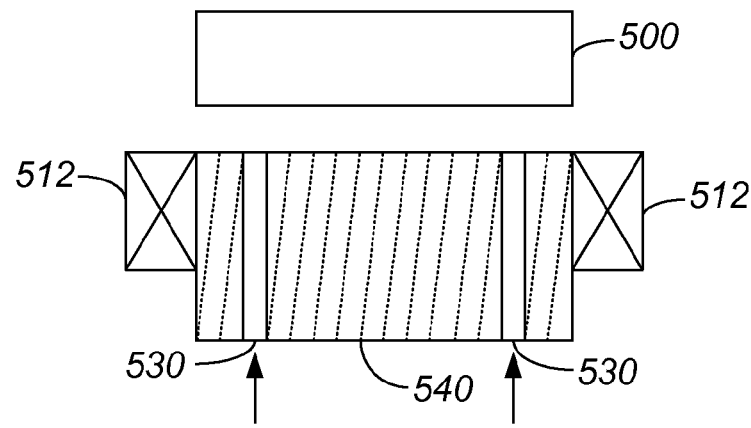
FIG. 5a is a diagrammatic cross-sectional representation of a reticle blind assembly with a first air bearing arrangement in accordance with an embodiment of the present invention.

As previously mentioned, reticle blind halves are generally supported on air bearings. The air bearings are "air hockey" type air bearings in that the air bearings are such that a relatively small, lightweight body, e.g., a magnet mounted on a reticle blind half, effectively floats atop an air cushion. An air supply for an air bearing arrangement may be provided through the core of a linear motor, or may be provided substantially separately. FIG. 5a is a representation of an air bearing arrangement with an air supply that is integrated into an iron core of a linear motor in accordance with an embodiment of the present invention. A reticle blind portion 500 is arranged above a linear motor that includes a core 540 and a coil assembly 512. Openings 530 in core 540 allow air to be supplied therethrough. The air enables reticle blind portion 500 to substantially float above core 540. By incorporating openings 530 which supply air within an air bearing arrangement into core 540, the overall size and mass of reticle blind portion 500, as well as the overall size and mass of a reticle blind system that includes reticle blind portion 500, may be reduced.

Reticle blind portion 500 includes magnets (not shown) which allow preloading of an air bearing arrangement to occur. Such magnets are generally lapped flat, and are coated to prevent oxidation and mechanical damage.

It should be appreciated that to substantially constrain the movement of reticle blind portion 500 such that reticle blind portion 500 remains at approximately a desired position in an x-direction, a mechanism (not shown) may be used to effectively prevent reticle blind portion 500 from moving excessively in the x-direction. Such a mechanism may be a one degree of freedom air bearing guide, an actuator such as a voice coil motor, or a passive electromagnetic device that serves as both a guide and a damper for reticle blind portion 500. A passive electromagnetic device is described in co-pending U.S. patent application Ser. No. 11/725,024 filed on Mar. 16, 2007, which is incorporated herein by reference in its entirety.

Figure 5B:
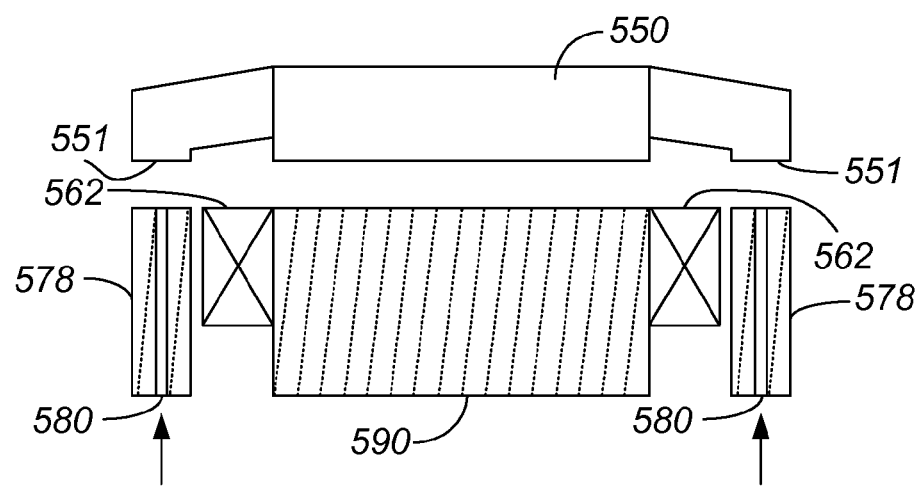
FIG. 5b is a diagrammatic cross-sectional representation of a reticle blind assembly with a second air bearing arrangement in accordance with an embodiment of the present invention.

With reference to FIG. 5b, an air bearing arrangement with air supplies that are not integrated into a core of a linear motor will be described in accordance with an embodiment of the present invention. A reticle blind portion 550 with extensions that include air bearing surfaces 551 is arranged at a distance from a core 590 about which a coil assembly 562 is positioned. Through openings 580 in bodies 578, air is supplied. The supplied air contacts air bearing surfaces 551 and allows reticle blind portion 550 to move over core 590. While the use of bodies 578 as a part of an air bearing arrangement increases the overall size and mass of a reticle blind system, the roll stiffness of reticle blind portion 550 is enhanced when the size of reticle blind portion 550 is increased to accommodate the use of bodies 578 through which air is supplied.

Figure 6A:
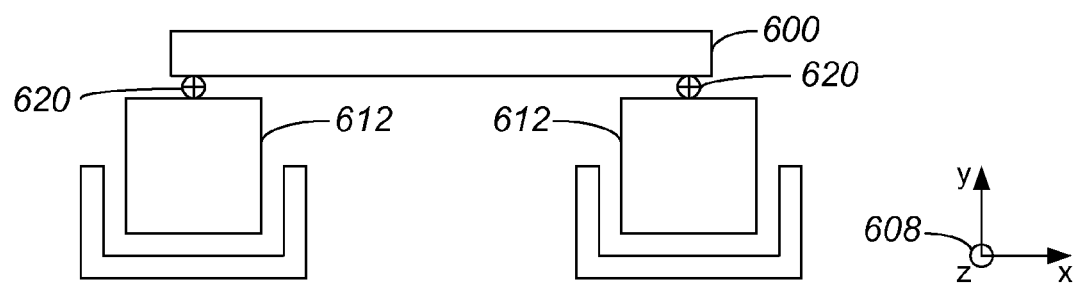
FIG. 6a is a diagrammatic cross-sectional representation of a first reticle blind system that shows push points in accordance with an embodiment of the present invention.

When a linear motor, e.g., an iron core motor that includes a core and a coil which is part of a counter mass arrangement, applies force to allow a reticle blind to move, a pitching moment may be generated on both the counter mass arrangement and on the reticle blind. As shown in FIG. 6a, a reticle blind 600 is positioned adjacent to a counter mass arrangement 612 in accordance with an embodiment of the present invention. Counter mass arrangement 612 absorbs reaction forces associated with the movement of reticle blind 600. It should be appreciated that counter mass arrangement 612 may generally include one or more coil assemblies of a linear motor, as well as components associated with an air bearing, e.g., a body that supports an opening through which air may be supplied. In addition, counter mass arrangement 612 may include substantially independent counter masses or may include a single counter mass.

Figure 6B:
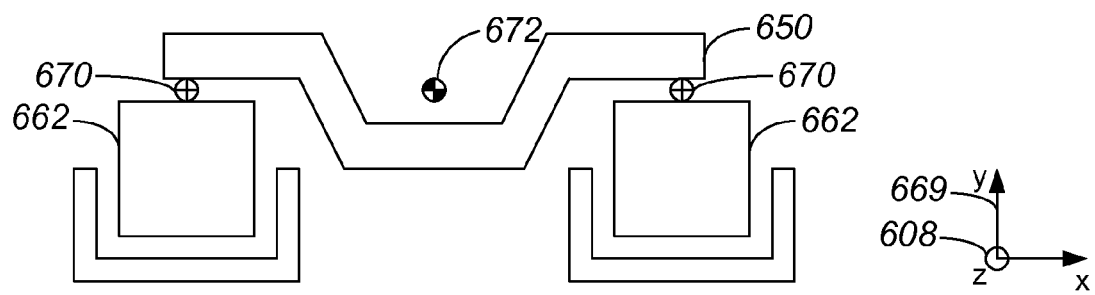
FIG. 6b is a diagrammatic cross-sectional representation of a second reticle blind system that shows push points in accordance with an embodiment of the present invention.

When a linear motor which includes a coil or coils of counter mass arrangement 612 imparts forces to move reticle blind 600 in a direction along a z-axis 608, the forces are applied on reticle blind 600 at push points 620. The forces applied at push points 620 may create pitching moments on counter mass arrangement 612 and on reticle blind 600. To substantially minimize any pitching moments, the center of gravity of a reticle blind may be arranged to be in line with motor push points. Referring next to FIG. 6b, a reticle blind that is shaped such that a center of gravity of the reticle blind is in line with motor push points will be described in accordance with an embodiment of the present invention. A reticle blind 650 arranged adjacent to a counter mass arrangement 662 is shaped such that a center of gravity 672 associated with reticle blind 650 is in line (at the same position relative to y-axis 669) with push points 670. When an actuator such as a linear motor (not shown) applies forces to enable reticle blind 650 to move, the forces are applied at push points 670. When center of gravity 672 is in line with push points 670, e.g., when center of gravity 672 is in line with push points 670 relative to y-axis 669, pitching moments associated with reticle blind 650 may be reduced.

Figure 6C:
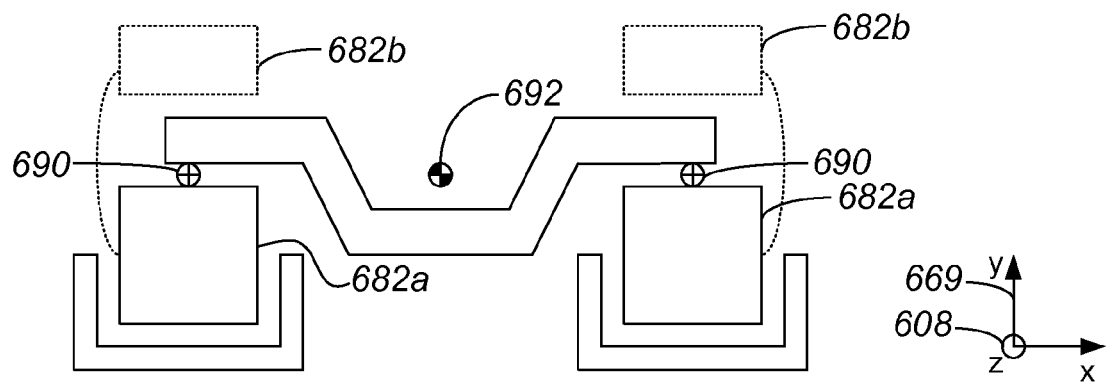
FIG. 6c is a diagrammatic cross-sectional representation of a third reticle blind system that shows push points in accordance with an embodiment of the present invention.

To reduce pitching moments associated with a counter mass arrangement, motor push points may be positioned such that the motor push points are located at a center of gravity of a counter mass arrangement. FIG. 6c is a diagrammatic cross-sectional representation of a reticle blind system that shows motor push points that coincide with a center of gravity of a counter mass arrangement in accordance with an embodiment of the present invention. Push points 690, at which motor forces are applied, are aligned with a center of gravity 692 of a reticle blind 680, relative to y-axis 669. A counter mass arrangement 682 includes a counter mass structure 682a and an extra mass 682b. Counter mass structure 682a typically includes a coil assembly or coil assemblies of a linear motor that applies forces at push points 690, as well as components associated with an air bearing. Extra mass 682*b* is arranged to effectively add mass to counter mass arrangement 682 such that push points 690 substantially coincide with a center of gravity of counter mass arrangement 682. When push points 690 are aligned with center of gravity 692 relative to y-axis 669, and a center of gravity of counter mass arrangement is located at push points 690, pitching moments created by forces applied at push points 690 may effectively be minimized.

Figure 7A:
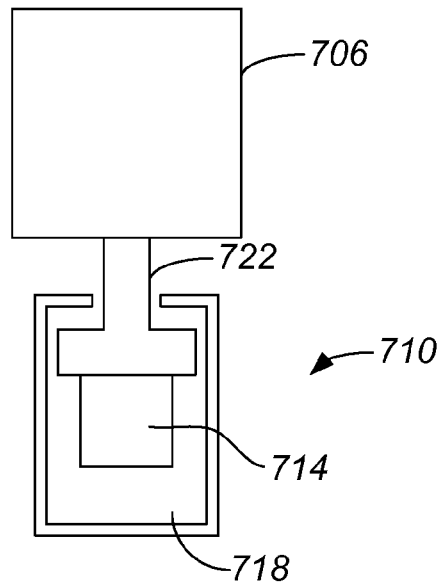
FIG. 7a is a diagrammatic representation of a counter mass with an anti-gravity device that is a pressurized air piston in accordance with an embodiment of the present invention.

As mentioned above with respect to FIG. 2*a*, anti-gravity devices may be used with a coil assembly, or a counter mass arrangement, associated with a vertical automatic reticle blind assembly to compensate for the forces of gravity that act on the coil or the counter mass arrangement. The configuration of an anti-gravity device may vary widely. FIG. 7*a* is a diagrammatic representation of a counter mass with an anti-gravity device that is a pressurized air piston in accordance with an embodiment of the present invention. An air piston 710 provides anti-gravity capabilities to support counter mass 706. Air piston 710 includes a pressurized air chamber 718 in which a piston member 722 is arranged. An actuator 714, which may be a voice coil motor, provides correction forces that allow piston member 722 to effectively support counter mass 706 against forces of gravity.

Figure 7B:
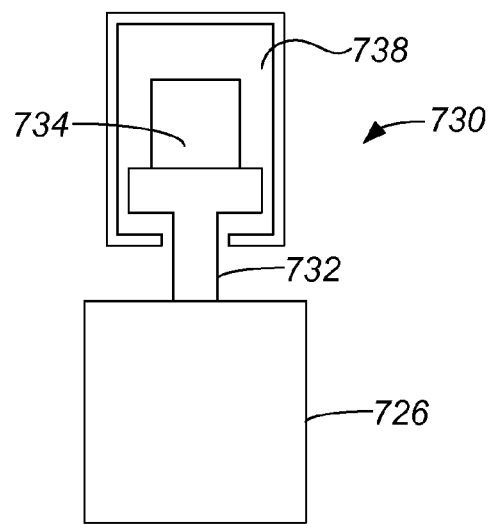
FIG. 7b is a diagrammatic representation of a counter mass with an anti-gravity device that is a vacuum air piston in accordance with an embodiment of the present invention.

In lieu of using a pressurized air piston to provide anti-gravity capabilities, a vacuum air piston, or an air piston with a vacuum chamber instead of a pressurized air chamber, may be used. FIG. 7*b* is a diagrammatic representation of a counter mass with an anti-gravity device that is a vacuum air piston in accordance with an embodiment of the present invention. A vacuum piston 730 is arranged over a counter mass 726. A vacuum applied within a vacuum chamber 738 of vacuum piston 730 effectively holds a piston member 732, to which counter mass 726 is mounted, in place. An actuator 734, which is positioned within vacuum piston 730, provides a correction force.

Figure 7C:
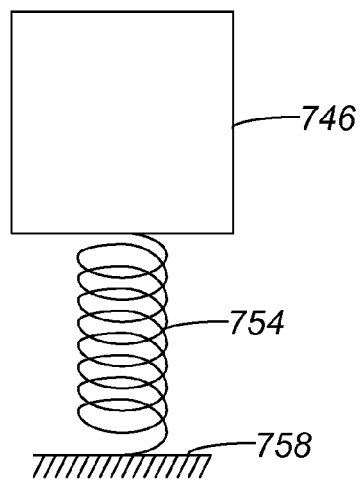
FIG. 7c is a diagrammatic representation of a counter mass with an anti-gravity device that is a spring in accordance with an embodiment of the present invention.
Figure 7D:
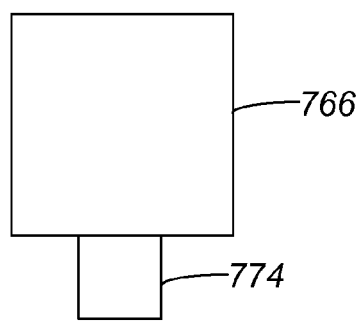
FIG. 7d is a diagrammatic representation with an anti-gravity device that is an actuator in accordance with an embodiment of the present invention.

In one embodiment, a mechanical spring may be used as an anti-gravity device that supports a counter mass. As shown in FIG. 7*c*, a spring 754 may be coupled to a counter mass 746 and to a substantially fixed surface 758. Fixed surface 758 may be an interior wall of an illumination unit. The stiffness of spring 754 may be varied depending upon the size and the mass of counter mass 746. A motor may also be used to support a counter mass. FIG. 7*d* is a diagrammatic representation of a counter mass 766 that is supported by a motor 774. As motor 774 may generate a fair amount of heat, the use of motor 774 may be more suitable when counter mass 766 is relatively small. When counter mass 766 is relatively small, the amount of force and, hence, the amount of heat generated by motor 774 may be relatively low.

Figure 8:
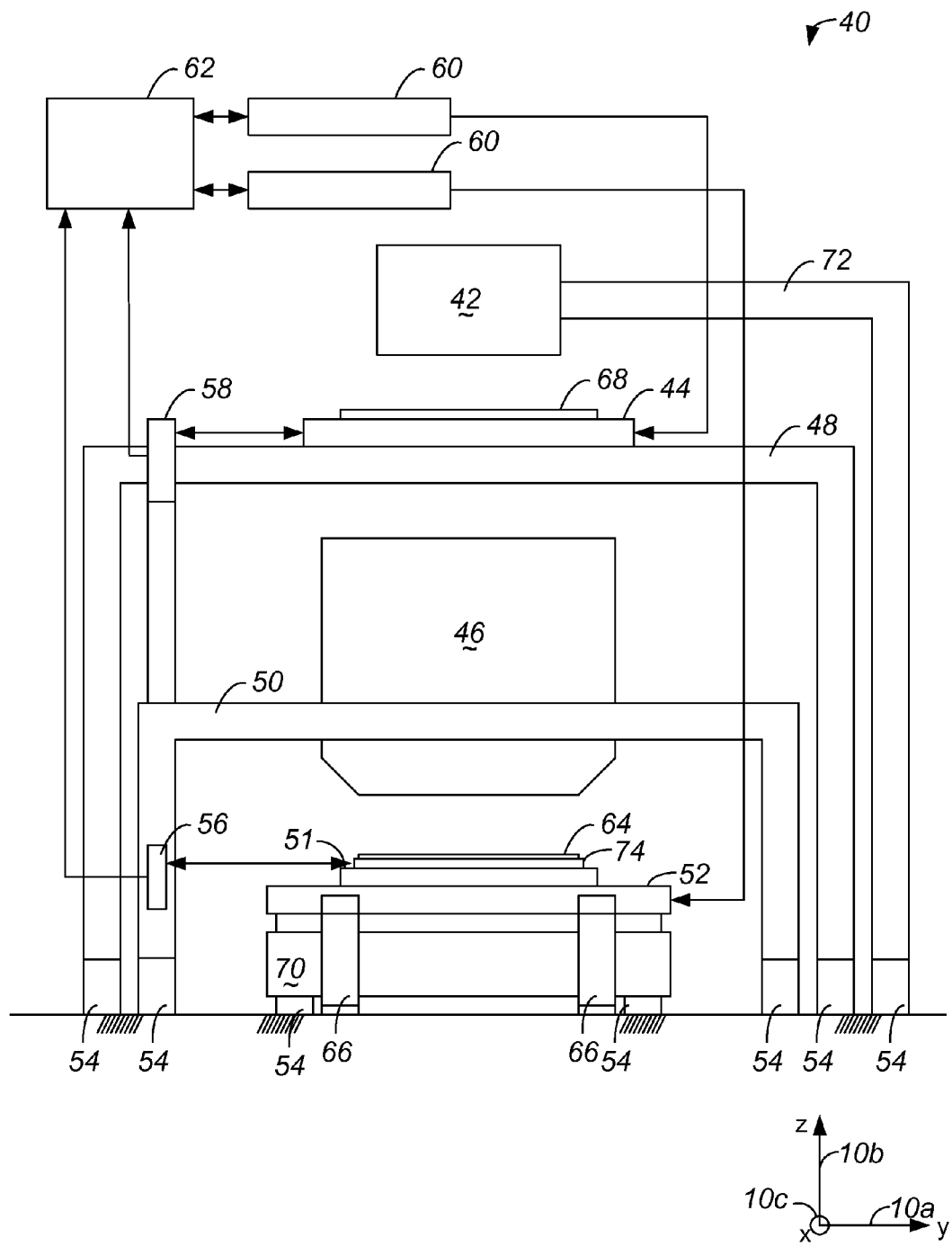
FIG. 8 is a diagrammatic representation of a photolithography apparatus in accordance with an embodiment of the present invention.

Referring next to FIG. 8, a photolithography apparatus which may utilize an automatic reticle blind will be described in accordance with an embodiment of the present invention. A photolithography apparatus (exposure apparatus) 40 includes a wafer positioning stage 52 that may be driven by linear or planar motors (not shown), as well as a wafer table 51 that is magnetically coupled to wafer positioning stage 52. The motor which drives or motors which drive wafer positioning stage 52 generally utilize an electromagnetic force generated by magnets and corresponding armature coils arranged in two dimensions. A wafer 64 is held in place on a wafer holder or chuck 74 which is coupled to wafer table 51. Wafer positioning stage 52 is arranged to move in multiple degrees of freedom, e.g., between three to six degrees of freedom, under the control of a control unit 60 and a system controller 62. In one embodiment, wafer positioning stage 52 may include a plurality of actuators which are coupled to a common magnet track. The movement of wafer positioning stage 52 allows wafer 64 to be positioned at a desired position and orientation relative to a projection optical system 46.

Wafer table 51 may be levitated in a z-direction 10*b* by any number of VCMs (not shown), e.g., three voice coil motors. In one embodiment, at least three magnetic bearings (not shown) couple and move wafer table 51 along a y-axis 10*a*. The motor array of wafer positioning stage 52 is typically supported by a base 70. Base 70 is supported to a ground via isolators 54. Reaction forces generated by motion of wafer stage 52 may be mechanically released to a ground surface through a frame 66. One suitable frame 66 is described in JP Hei 8-166475 and U.S. Pat. No. 5,528,118, which are each herein incorporated by reference in their entireties.

An illumination system 42, in which an automatic reticle blind may be positioned, is supported by a frame 72. Frame 72 is supported to the ground via isolators 54. Frame 72 may be part of a lens mount system of illumination system 42, and may be coupled to an active damper (not shown) which damps vibrations in frame 72 and, hence, illumination system 42. Illumination system 42 includes an illumination source, and is arranged to project a radiant energy, e.g., light, through a mask pattern on a reticle 68 that is supported by and scanned using a reticle stage 44 which includes a coarse stage and a fine stage. The radiant energy is focused through projection optical system 46, which is supported on a projection optics frame 50 and may be supported the ground through isolators 54. Suitable isolators 54 include those described in JP Hei 8-330224 and U.S. Pat. No. 5,874,820, which are each incorporated herein by reference in their entireties.

A first interferometer 56 is supported on projection optics frame 50, and functions to detect the position of wafer table 51. Interferometer 56 outputs information on the position of wafer table 51 to system controller 62. In one embodiment, wafer table 51 has a force damper which reduces vibrations associated with wafer table 51 such that interferometer 56 may accurately detect the position of wafer table 51. A second interferometer 58 is supported on projection optics frame 50, and detects the position of reticle stage 44 which supports a reticle 68. Interferometer 58 also outputs position information to system controller 62.

It should be appreciated that there are a number of different types of photolithographic apparatuses or devices. For example, photolithography apparatus 40, or an exposure apparatus, may be used as a scanning type photolithography system which exposes the pattern from reticle 68 onto wafer 64 with reticle 68 and wafer 64 moving substantially synchronously. In a scanning type lithographic device, reticle 68 is moved perpendicularly with respect to an optical axis of a lens assembly (projection optical system 46) or illumination system 42 by reticle stage 44. Wafer 64 is moved perpendicularly to the optical axis of projection optical system 46 by a wafer positioning stage 52. Scanning of reticle 68 and wafer 64 generally occurs while reticle 68 and wafer 64 are moving substantially synchronously.

Alternatively, photolithography apparatus or exposure apparatus 40 may be a step-and-repeat type photolithography system that exposes reticle 68 while reticle 68 and wafer 64 are stationary, i.e., at a substantially constant velocity of approximately zero meters per second. In one step and repeat process, wafer 64 is in a substantially constant position relative to reticle 68 and projection optical system 46 during the exposure of an individual field. Subsequently, between consecutive exposure steps, wafer 64 is consecutively moved by wafer positioning stage 52 perpendicularly to the optical axis of projection optical system 46 and reticle 68 for exposure. Following this process, the images on reticle 68 may be sequentially exposed onto the fields of wafer 64 so that the next field of semiconductor wafer 64 is brought into position relative to illumination system 42, reticle 68, and projection optical system 46.

It should be understood that the use of photolithography apparatus or exposure apparatus 40, as described above, is not limited to being used in a photolithography system for semiconductor manufacturing. For example, photolithography apparatus 40 may be used as a part of a liquid crystal display (LCD) photolithography system that exposes an LCD device pattern onto a rectangular glass plate or a photolithography system for manufacturing a thin film magnetic head.

The illumination source of illumination system 42 may be g-line (436 nanometers (nm)), i-line (365 nm), a KrF excimer laser (248 nm), an ArF excimer laser (193 nm), and an F2-type laser (157 nm). Alternatively, illumination system 42 may also use charged particle beams such as x-ray and electron beams. For instance, in the case where an electron beam is used, thermionic emission type lanthanum hexaboride (LaB6) or tantalum (Ta) may be used as an electron gun. Furthermore, in the case where an electron beam is used, the structure may be such that either a mask is used or a pattern may be directly formed on a substrate without the use of a mask.

With respect to projection optical system 46, when far ultra-violet rays such as an excimer laser is used, glass materials such as quartz and fluorite that transmit far ultra-violet rays is preferably used. When either an F2-type laser or an x-ray is used, projection optical system 46 may be either catadioptric or refractive (a reticle may be of a corresponding reflective type), and when an electron beam is used, electron optics may comprise electron lenses and deflectors. As will be appreciated by those skilled in the art, the optical path for the electron beams is generally in a vacuum.

In addition, with an exposure device that employs vacuum ultra-violet (VUV) radiation of a wavelength that is approximately 200 nm or lower, use of a catadioptric type optical system may be considered. Examples of a catadioptric type of optical system include, but are not limited to, those described in Japan Patent Application Disclosure No. 8-171054 published in the Official gazette for Laid-Open Patent Applications and its counterpart U.S. Pat. No. 5,668,672, as well as in Japan Patent Application Disclosure No. 10-20195 and its counterpart U.S. Pat. No. 5,835,275, which are all incorporated herein by reference in their entireties. In these examples, the reflecting optical device may be a catadioptric optical system incorporating a beam splitter and a concave mirror. Japan Patent Application Disclosure (Hei) No. 8-334695 published in the Official gazette for Laid-Open Patent Applications and its counterpart U.S. Pat. No. 5,689,377, as well as Japan Patent Application Disclosure No. 10-3039 and its counterpart U.S. Pat. No. 5,892,117, which are all incorporated herein by reference in their entireties. These examples describe a reflecting-refracting type of optical system that incorporates a concave mirror, but without a beam splitter, and may also be suitable for use with the present invention.

The present invention may be utilized, in one embodiment, in an immersion type exposure apparatus if suitable measures are taken to accommodate a fluid. For example, PCT patent application WO 99/49504, which is incorporated herein by reference in its entirety, describes an exposure apparatus in which a liquid is supplied to a space between a substrate (wafer) and a projection lens system during an exposure process. Aspects of PCT patent application WO 99/49504 may be used to accommodate fluid relative to the present invention.

Further, the present invention may be utilized in an exposure apparatus that comprises two or more substrate and/or reticle stages. In such an apparatus, e.g., an apparatus with two substrate stages, one substrate stage may be used in parallel or preparatory steps while the other substrate stage is utilizes for exposing. Such a multiple stage exposure apparatus is described, for example, in Japan patent Application Disclosure No. 10-163099, as well as in Japan patent Application Disclosure No. 10-214783 and its U.S counterparts, namely U.S. Pat. No. 6,341,007, U.S. Pat. No. 6,400,441, U.S. Pat. No. 6,549,269, U.S. Pat. No. 6,590,634. Each of these Japan patent Application Disclosures and U.S. Patents are incorporated herein by reference in their entireties. A multiple stage exposure apparatus is also described in Japan patent Application Disclosure No. 20000-505958 and its counterparts U.S. Pat. No. 5,969,441 and U.S. Pat. No. 6,208, 407, each of which are incorporated herein by reference in their entireties.

The present invention may be utilized in an exposure apparatus that has a movable stage that retains a substrate (wafer) for exposure, as well as a stage having various sensors or measurement tools, as described in Japan patent Application Disclosure No. 11-135400, which is incorporated herein by reference in its entirety. In addition, the present invention may be utilized in an exposure apparatus that is operated in a vacuum environment such as an EB type exposure apparatus and an EUVL type exposure apparatus when suitable measures are incorporated to accommodate the vacuum environment for air (fluid) bearing arrangements.

Further, in photolithography systems, when linear motors (see U.S. Pat. Nos. 5,623,853 or 5,528,118, which are each incorporated herein by reference in their entireties) are used in a wafer stage or a reticle stage, the linear motors may be either an air levitation type that employs air bearings or a magnetic levitation type that uses Lorentz forces or reactance forces. Additionally, the stage may also move along a guide, or may be a guideless type stage which uses no guide.

Alternatively, a wafer stage or a reticle stage may be driven by a planar motor which drives a stage through the use of electromagnetic forces generated by a magnet unit that has magnets arranged in two dimensions and an armature coil unit that has coil in facing positions in two dimensions. With this type of drive system, one of the magnet unit or the armature coil unit is connected to the stage, while the other is mounted on the moving plane side of the stage.

Movement of the stages as described above generates reaction forces which may affect performance of an overall photolithography system. Reaction forces generated by the wafer (substrate) stage motion may be mechanically released to the floor or ground by use of a frame member as described above, as well as in U.S. Pat. No. 5,528,118 and published Japanese Patent Application Disclosure No. 8-166475. Additionally, reaction forces generated by the reticle (mask) stage motion may be mechanically released to the floor (ground) by use of a frame member as described in U.S. Pat. No. 5,874,820 and published Japanese Patent Application Disclosure No. 8-330224, which are each incorporated herein by reference in their entireties.

Isolators such as isolators 54 may generally be associated with an active vibration isolation system (AVIS). An AVIS generally controls vibrations associated with forces, i.e., vibrational forces, which are experienced by a stage assembly or, more generally, by a photolithography machine such as photolithography apparatus 40 which includes a stage assembly.

A photolithography system according to the above-described embodiments, e.g., a photolithography apparatus which makes use of an automatic reticle blind such as a horizontal automatic reticle blind or a vertical automatic reticle blind, may be built by assembling various subsystems in such a manner that prescribed mechanical accuracy, electrical accuracy, and optical accuracy are maintained. In order to maintain the various accuracies, prior to and following assembly, substantially every optical system may be adjusted to achieve its optical accuracy. Similarly, substantially every mechanical system and substantially every electrical system may be adjusted to achieve their respective desired mechanical and electrical accuracies. The process of assembling each subsystem into a photolithography system includes, but is not limited to, developing mechanical interfaces, electrical circuit wiring connections, and air pressure plumbing connections between each subsystem. There is also a process where each subsystem is assembled prior to assembling a photolithography system from the various subsystems. Once a photolithography system is assembled using the various subsystems, an overall adjustment is generally performed to ensure that substantially every desired accuracy is maintained within the overall photolithography system. Additionally, it may be desirable to manufacture an exposure system in a clean room where the temperature and humidity are controlled.

Figure 9:
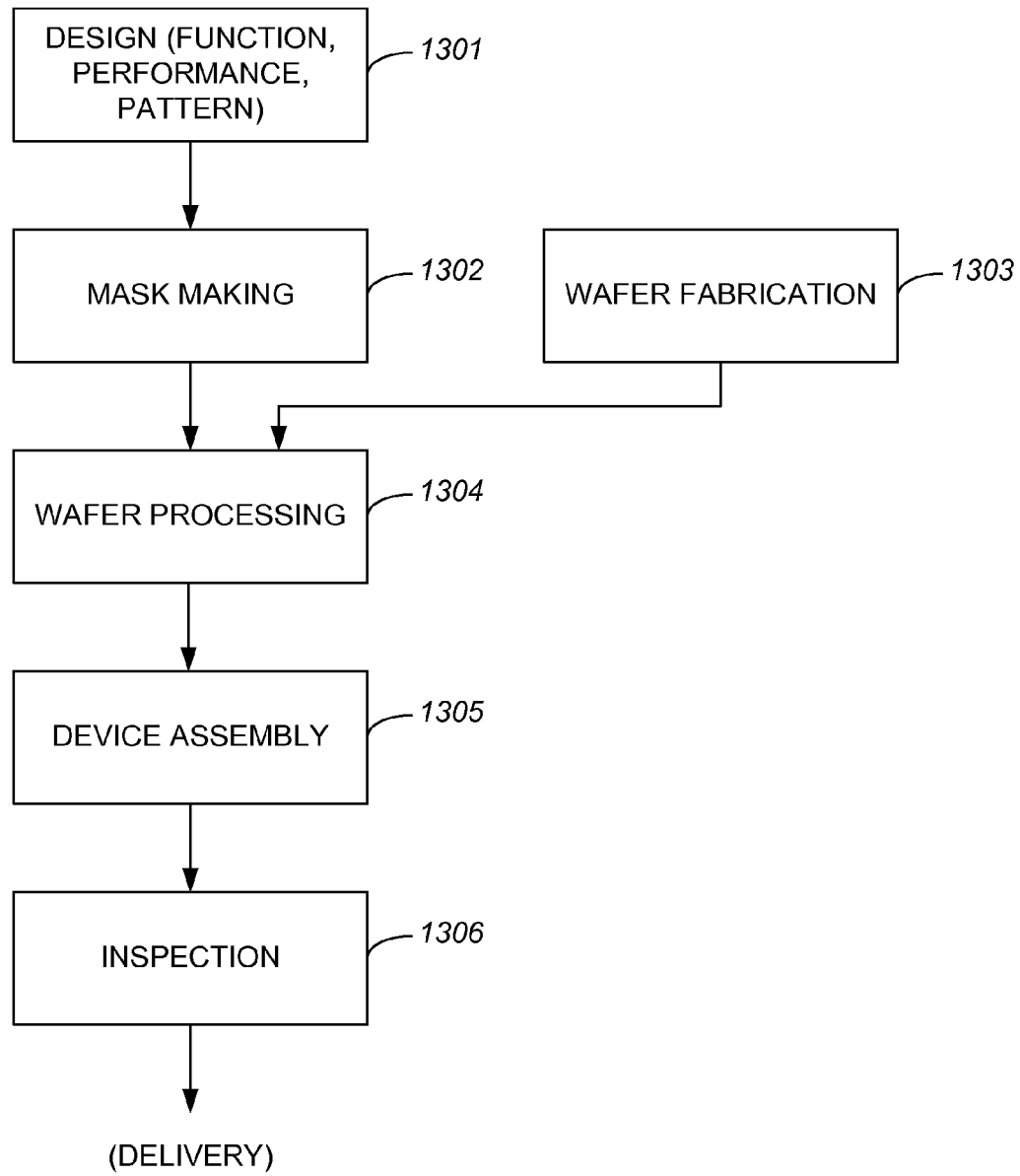
FIG. 9 is a process flow diagram which illustrates the steps associated with fabricating a semiconductor device in accordance with an embodiment of the present invention.

Further, semiconductor devices may be fabricated using systems described above, as will be discussed with reference to FIG. 9. The process begins at step 1301 in which the function and performance characteristics of a semiconductor device are designed or otherwise determined. Next, in step 1302, a reticle (mask) in which has a pattern is designed based upon the design of the semiconductor device. It should be appreciated that in a parallel step 1303, a wafer is made from a silicon material. The mask pattern designed in step 1302 is exposed onto the wafer fabricated in step 1303 in step 1304 by a photolithography system. One process of exposing a mask pattern onto a wafer will be described below with respect to FIG. 10. In step 1305, the semiconductor device is assembled. The assembly of the semiconductor device generally includes, but is not limited to, wafer dicing processes, bonding processes, and packaging processes. Finally, the completed device is inspected in step 1306.

Figure 10:
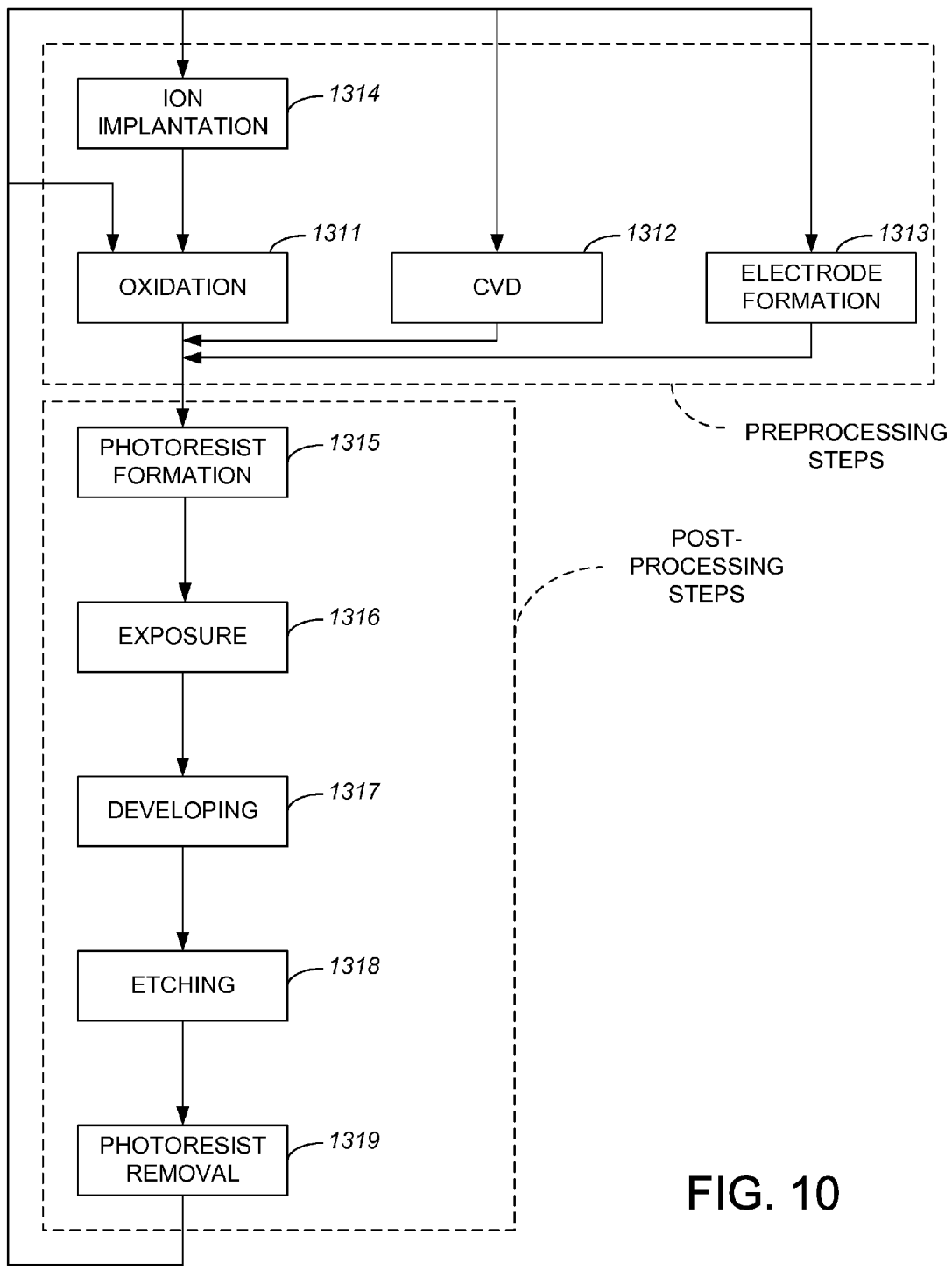
FIG. 10 is a process flow diagram which illustrates the steps associated with processing a wafer, i.e., step 1304 of FIG. 9, in accordance with an embodiment of the present invention.

FIG. 10 is a process flow diagram which illustrates the steps associated with wafer processing in the case of fabricating semiconductor devices in accordance with an embodiment of the present invention. In step 1311, the surface of a wafer is oxidized. Then, in step 1312 which is a chemical vapor deposition (CVD) step, an insulation film may be formed on the wafer surface. Once the insulation film is formed, in step 1313, electrodes are formed on the wafer by vapor deposition. Then, ions may be implanted in the wafer using substantially any suitable method in step 1314. As will be appreciated by those skilled in the art, steps 1311-1314 are generally considered to be preprocessing steps for wafers during wafer processing. Further, it should be understood that selections made in each step, e.g., the concentration of various chemicals to use in forming an insulation film in step 1312, may be made based upon processing requirements.

At each stage of wafer processing, when preprocessing steps have been completed, post-processing steps may be implemented. During post-processing, initially, in step 1315, photoresist is applied to a wafer. Then, in step 1316, an exposure device may be used to transfer the circuit pattern of a reticle to a wafer. Transferring the circuit pattern of the reticle of the wafer generally includes scanning a reticle scanning stage. It should be appreciated that when the circuit pattern of the reticle is transferred to the wafer, an automatic reticle blind is generally in an open position to allow a laser beam to pass therethrough.

After the circuit pattern on a reticle is transferred to a wafer, the exposed wafer is developed in step 1317. Once the exposed wafer is developed, parts other than residual photoresist, e.g., the exposed material surface, may be removed by etching. Finally, in step 1319, any unnecessary photoresist that remains after etching may be removed. As will be appreciated by those skilled in the art, multiple circuit patterns may be formed through the repetition of the preprocessing and post-processing steps.

Although only a few embodiments of the present invention have been described, it should be understood that the present invention may be embodied in many other specific forms without departing from the spirit or the scope of the present invention. By way of example, one process of using an automatic reticle blind to shield an exposure area involves lining up the exposure area behind one half of the reticle blind, then moving that half to expose the area. In lieu of lining of the exposure area behind one half of the reticle blind, the exposure area may instead be aligned behind both halves of a reticle blind. When the exposure area is aligned behind both halves of the reticle blind, both halves of the reticle blind may move to effectively open the reticle blind such that the exposure area may be exposed.

While a reticle blind may include two portions or halves, a reticle blind may instead include more than two portions. For instance, a reticle blind may include four portions that are each arranged to move. In one embodiment, the use of four portions for a reticle blind may enable the size of an opening or a slit in the reticle blind to be precisely controlled relative to more than one axis.

An air bearing arrangement that is used in a reticle blind assembly has been described as either being incorporated into a core of a linear motor, or being separate from the linear motor. In one embodiment, openings which allow air to be supplied to an air bearing surface may instead be incorporated into a moving part of the assembly rather than in a substantially stationary part of the assembly. It should be appreciated that as drag, e.g., drag associated with air supply hoses or cables, may be generated when air is supplied through a moving part, measures may need to be taken to reduce the effects of drag.

An automatic blind has been described as being used to shield a reticle from a laser. In general, an automatic blind may be used to shield substantially any object. For instance, an automatic blind may be arranged to shield a wafer. Additionally, an automatic blind may shield an object such as a reticle from any light source or otherwise contaminating source.

The steps associated with using an automatic reticle blind may vary widely. Steps may be added, removed, and altered without departing from the spirit or scope of the present invention. For example, a reticle blind that includes two halves may be arranged such that only one half of the reticle blind moves to shield and to unshield an exposure area of a wafer. Therefore, the present examples are to be considered as illustrative and not restrictive, and the invention is not to be limited to the details given herein, but may be modified within the scope of the appended claims.

The invention claimed is:

1. A blind arrangement, the blind arrangement comprising:
a coil assembly, the coil assembly including at least one coil which has a core;
an air supply, the air supply being arranged to supply air from the coil assembly;
a first blind portion, the first blind portion including at least one magnet, the first blind portion being arranged to be supported at a distance from the at least one coil by a magnetic attraction between the core and the magnet, the first blind portion further being arranged to be supported by the air, wherein the first blind portion is arranged to be moved by interaction of the magnet with the coil, the first blind portion further being arranged to shield an object when the first blind portion is in a first position and is not in direct contact with the at least one coil.

2. The blind arrangement of claim 1 further including:
a second blind portion, the second blind portion including at least one magnet, the second blind portion being arranged to be supported at a distance from the at least one coil by a magnetic attraction between the core and the magnet, the second blind portion further being arranged to be supported by the air, wherein the second blind portion is arranged to be mobbed by interaction of the magnet with the coil, the second blind portion further being arranged to cooperate with the first blind portion to shield the object.

3. The blind arrangement of claim 2 further including:
an air bearing arrangement, the air bearing arrangement including the air supply, wherein the air supply is arranged to supply the air though openings defined in the core.

4. The blind arrangement of claim 1 wherein the coil assembly is a part of a counter mass arrangement, the counter mass arrangement being arranged to absorb reaction forces generated when the first blind portion and the second blind portion are moved.

5. The blind arrangement of claim 4 further including:
an anti-gravity device, the anti-gravity device being arranged to support the counter mass arrangement against gravity forces.

6. The blind arrangement of claim 5 wherein the first blind portion is arranged to move in a vertical direction.

7. The blind arrangement of claim 5 wherein the anti-gravity device is one of a piston arrangement, a spring, and an actuator.

8. The blind arrangement of claim 1 wherein the coil assembly and a magnet operate as an iron core linear motor.

9. The blind arrangement of claim 1 wherein the object is a reticle, and the first blind portion is arranged to shield the reticle from a laser beam.

10. The blind arrangement of claim 9 wherein the blind arrangement is part of an illumination system of an exposure apparatus.

11. A device manufactured with the exposure apparatus of claim 10.

12. A wafer on which an image has been formed by the exposure apparatus of claim 10.

13. An illumination system for use in an exposure process, the illumination system comprising:
a reticle arrangement;
a laser arrangement, the laser arrangement being arranged to produce a laser beam;
an illumination unit, the illumination unit being arranged between the reticle arrangement and the laser arrangement, wherein the laser beam is arranged to pass from the laser arrangement through the illumination unit to the reticle arrangement; and
a blind arrangement, the blind arrangement being arranged to control the passage of the laser beam to the reticle arrangement, the blind arrangement being positioned in the illumination unit, wherein the blind arrangement includes a first blind portion having at least one magnet and a second blind portion having at least one magnet, the blind arrangement further having a coil assembly, the first blind portion and the second blind portion being arranged to be supported by an air bearing arrangement at a distance from the coil assembly such that the first blind portion and the second blind portion are not in contact with the coil assembly.

14. The illumination system of claim 13 wherein the blind arrangement is arranged such that the first blind portion is arranged to move in a vertical direction when the at least one magnet cooperates with the coil assembly.

15. The illumination system of claim 14 wherein the blind arrangement includes a counter mass arrangement that includes the coil assembly.

16. The illumination system of claim 15 wherein the counter mass is one of a piston arrangement, an actuator arrangement, and a spring.

17. The illumination system of claim 15 wherein the blind arrangement includes an anti-gravity device arranged to support the counter mass arrangement against gravity forces.

18. The illumination system of claim 13 wherein the illumination system includes a core and the air bearing arrangement includes an air supply, the air supply being arranged to supply air to a surface of the first blind portion through an opening in the core.

19. The illumination system of claim 13 wherein the blind arrangement includes a plurality of encoders and the first blind portion includes a scale arranged to be read by the plurality of encoders to determine a position of the first blind portion.

20. The illumination system of claim 13 wherein the blind arrangement includes a plurality of interferometers and the first blind portion includes a scale arranged to be read by the plurality of interferometers to determine a position of the first blind portion.

21. The illumination system of claim 13 wherein the illumination system is part of an exposure apparatus.

22. A blind arrangement, the blind arrangement comprising:
a first blind portion, wherein the first blind portion is not coupled to a wire or a hose;
an air bearing arrangement, the air bearing arrangement including an air supply arranged to supply air; and
an iron core motor, the iron core motor including a coil arrangement, the first blind portion being supported at a distance from the coil arrangement by the air, wherein the iron core motor is arranged to cause the first blind portion to move and wherein the iron core motor includes at least one passive electromagnetic guide.

* * * * *